United States Patent
Coutts et al.

(10) Patent No.: US 9,871,506 B2
(45) Date of Patent: Jan. 16, 2018

(54) SWITCHABLE DECOUPLING CAPACITORS

(71) Applicant: QUALCOMM Incorporated, San Diego, CA (US)

(72) Inventors: Ryan Michael Coutts, Carlsbad, CA (US); Mikhail Popovich, San Marcos, CA (US)

(73) Assignee: QUALCOMM Incorporated, San Diego, CA (US)

(*) Notice: Subject to any disclaimer, the term of this patent is extended or adjusted under 35 U.S.C. 154(b) by 925 days.

(21) Appl. No.: 14/254,872

(22) Filed: Apr. 16, 2014

(65) Prior Publication Data
US 2015/0303912 A1 Oct. 22, 2015

(51) Int. Cl.
*H02J 3/14* (2006.01)
*H03K 17/16* (2006.01)
*G06F 1/28* (2006.01)
*H03K 19/0175* (2006.01)
*H02J 7/00* (2006.01)
*H03K 17/14* (2006.01)
*H02J 9/06* (2006.01)
*H03K 19/20* (2006.01)
*G06F 1/26* (2006.01)

(52) U.S. Cl.
CPC .............. *H03K 17/16* (2013.01); *G06F 1/26* (2013.01); *G06F 1/28* (2013.01); *H02J 7/0063* (2013.01); *H02J 9/061* (2013.01); *H03K 17/145* (2013.01); *H03K 19/0175* (2013.01); *H03K 19/20* (2013.01)

(58) Field of Classification Search
CPC .. H03K 19/20; H03K 17/145; H03K 19/0175; H02J 7/0063; H02J 9/061; G06F 1/28; G06F 1/26

USPC ........ 327/427; 326/82; 713/300; 307/29, 30, 307/40
See application file for complete search history.

(56) References Cited

U.S. PATENT DOCUMENTS

| | | | |
|---|---|---|---|
| 7,199,490 B2 | 4/2007 | Nomura | |
| 7,701,277 B2 | 4/2010 | Toffolon et al. | |
| 8,427,224 B2 | 4/2013 | Lin et al. | |
| 2005/0062523 A1 | 3/2005 | Wang et al. | |
| 2009/0179669 A1* | 7/2009 | Bartley | G06F 1/26 326/82 |
| 2010/0148304 A1 | 6/2010 | Rahim et al. | |
| 2013/0138978 A1 | 5/2013 | Barowski et al. | |
| 2015/0077170 A1* | 3/2015 | Bose | H02J 1/00 327/427 |

OTHER PUBLICATIONS

Chang M.H., et al., "Multi-layer adaptive power management architecture for TSV 3DIC applications," IEEE 63rd Electronic Components and Technology Conference (ECTC), 2013, pp. 1179-1185.
International Search Report and Written Opinion—PCT/US2015/020539—ISA/EPO—dated Jul. 30, 2015.

* cited by examiner

*Primary Examiner* — Arnold Kinkead
(74) *Attorney, Agent, or Firm* — Arent Fox, LLP and Qualcomm, Incorporated

(57) ABSTRACT

Aspects of an integrated circuit are disclosed. The integrated circuit includes a first circuit configured to be powered by a first voltage source, a second circuit configured to be powered by a second voltage source, a decoupling capacitor, and a controller configured to switch the decoupling capacitor between the first and second voltage source.

9 Claims, 6 Drawing Sheets

SWITCHABLE DECOUPLING CAPACITORS

BACKGROUND

Field

The present disclosure relates generally to electronic circuits, and more particularly, to switchable decoupling capacitors.

Background

Recent advancements in manufacturing processes for integrated circuits have enabled designers to integrate all components of a computer or other electronic system onto a single monolithic integrated circuit known as a "System-on-a-Chip" (SOC). These integrated circuits are often used in mobile battery powered devices such as cellular phones, smart phones, personal digital assistants, embedded systems, laptop computers, media players, electronic gaming systems, global positioning systems, sensors, or any other suitable devices. Depending on the device, the SOC may include various digital and analog circuits that perform various functions. For example, an SOC may include processors, controllers, graphics, video circuits, audio circuits, wireless modems, networking circuits, memories, peripheral interface circuits, bus interface circuits, sensors, detectors, user interfaces, and/or other suitable circuits.

As the demand for more processing capability continues to expand, there is an ever increasing need for effective power management systems to reduce power consumption and thereby conserve battery life in mobile devices. Various techniques have been employed. One such technique involves operating certain circuits in a low power or sleep mode when not in use. This technique reduces power consumption, but may adversely affect transient voltage levels when a circuit transitions from the sleep to the active mode. Specifically, the instantaneous increase in current required by the transitioning circuit can cause a sudden voltage drop to other circuits on the SOC. Decoupling capacitors are often used to supply this current to a transitioning circuit to help maintain a constant voltage across other circuits. However, decoupling capacitors occupy a considerable amount of surface area on the SOC. Accordingly, there is a need in the art for decoupling capacitors with a small footprint that reduce variations in transient voltage levels.

SUMMARY

Aspects of an integrated circuit are disclosed. The integrated circuit includes a first circuit configured to be powered by a first voltage source, a second circuit configured to be powered by a second voltage source, a decoupling capacitor, and a controller configured to switch the decoupling capacitor between the first and second voltage source.

Further aspects of an integrated circuit are disclosed. The integrated circuit includes first processing means for processing data, the first processing means being configured to be powered by a first voltage source, second processing means for processing data, the second processing means being configured to be powered by a second voltage, decoupling means for decoupling the first and second circuit means, and means for switching the decoupling means between the first and second voltage sources.

Aspects of a method of decoupling first and second circuits includes processing data with the first circuit powered by a first voltage source, processing data with the second circuit powered by a second voltage, and switching a decoupling capacitor between the first and second voltage sources.

It is understood that other aspects of apparatus and methods will become readily apparent to those skilled in the art from the following detailed description, wherein various aspects of apparatus and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatus and methods will now be presented in the detailed description by way of example, and not by way of limitation, with reference to the accompanying drawings, wherein.

DETAILED DESCRIPTION

Figure 1:
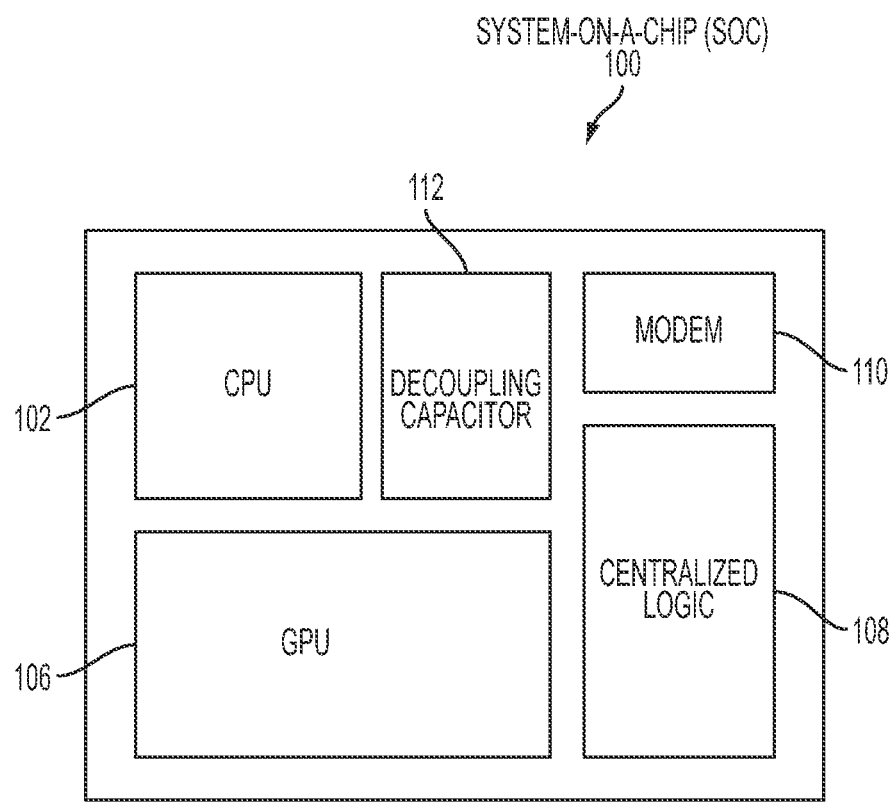
FIG. 1 is a conceptual diagram of an exemplary embodiment of a system-on-a-chip (SOC).

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus or method does not require that all embodiments of the invention include the described components, structure, features, functionality, processes, advantages, benefits, or modes of operation.

The terms "connected," "coupled," or any variant thereof, means any connection or coupling, either direct or indirect, between two or more elements, and can encompass the presence of one or more intermediate elements between two elements that are "connected" or "coupled" together.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

The terms "comprises", "comprising," "includes" and/or "including," when used herein, specify the presence of the stated features, integers, steps, operations, elements, and/or components, but do not preclude the presence or addition of one or more other features, integers, steps, operations, elements, components, and/or groups thereof.

Various aspects of switchable decoupling capacitors will now be presented in the context of an SOC for a mobile battery-powered device. However, such aspects may be extended to SOCs for electronic devices that have a fixed location and/or are not battery powered (e.g., desktop computers, household appliances, etc.). Moreover, as those skilled in the art will readily appreciate, the various aspects of switchable decoupling capacitors presented in this disclosure are not limited to SOCs, but may be applied to other types of integrated circuits or chips. For example, switchable decoupling capacitors may be used in processor chips, controller chips, graphics chips, digital signal processing chips, application specific integrated circuits, video chips, audio chips, wireless modem chips, logic chips, and/or other suitable integrated circuits. Accordingly, any reference to a specific application for a switchable decoupling capacitor is intended only to illustrate exemplary aspects of the present invention with the understanding that such aspects may have a wide range of applications.

As discussed in the background portion of the disclosure, SOCs are often used in mobile battery-powered devices such as such as cellular phones, smart phones, personal digital assistants, embedded systems, laptop computers, media players, electronic gaming systems, global positioning systems, sensors, and other suitable devices. An exemplary embodiment of a SOC will be presented with reference to FIG. 1. The SOC 100 includes a central processing unit (CPU) 102 for executing software programs and a graphics processing unit (GPU) 106 for rendering graphics. A system bus (not shown) interconnects the CPU 102, the GPU 106, and memory (not shown). A peripheral bus (not shown) interconnects the system bus with centralized logic 108 and various peripheral interfaces, including a wireless modem 110 which supports any suitable air interface standard or protocol.

The SOC 100 may also include a means for supplying power to the circuitry comprising a positive voltage rail $V_{DD}$ (not shown) and a negative voltage rail $V_{SS}$ (not shown) (e.g., ground). In at least one exemplary embodiment of an SOC 100, multiple voltage domains may be generated by one or more internal (or external) voltage regulators. A decoupling capacitor 112 that is shared between two voltage domains may be used to provide a more stable power source to the various circuits operating on the SOC 100. By sharing a decoupling capacitor between two voltage domains, a considerable amount of surface area on the SOC may saved as compared to having a separate decoupling capacitor for each voltage domain. Alternatively, the decoupling capacitance provided to each voltage domain may be increased by sharing a decoupling capacitor without increasing the surface area on the SOC that would otherwise be required with separate decoupling capacitors for each voltage domain.

As will be explained in greater detail below, the decoupling capacitor 112 may serve as an energy reserve to prevent or reduce transient variations in voltage levels during switching. For example, the decoupling capacitor 112 may provide an instantaneous current source to a circuit in a first voltage domain that is switching from a sleep mode to an active mode to prevent or reduce a sudden drop in voltage to other circuitry operating in the first voltage domain. Similarly, the decoupling capacitor 112 may provide an instantaneous current source to a circuit in a second voltage domain that is switching from a sleep mode to an active mode to prevent or reduce a sudden drop in voltage to other circuitry operating in the second voltage domain.

Figure 2:
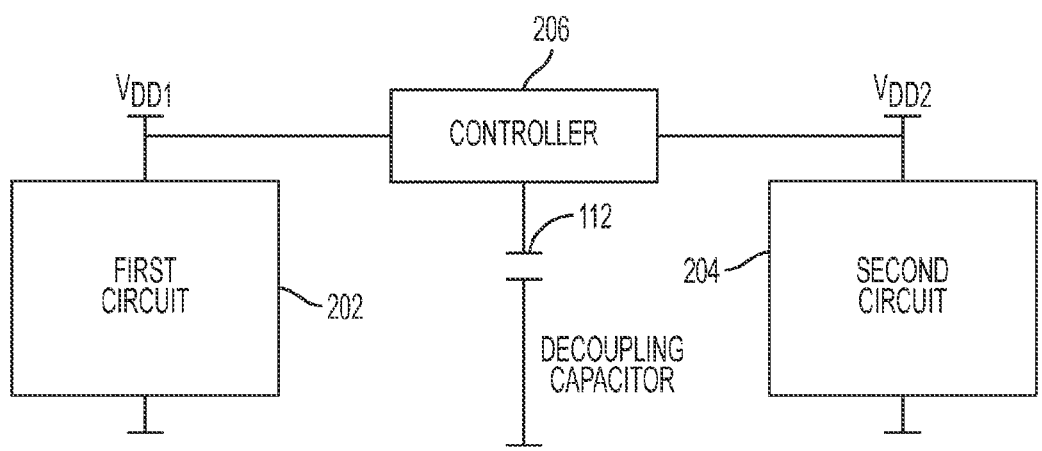
FIG. 2 is a functional block diagram illustrating an exemplary embodiment of first and second circuits operating in different power domains sharing a decoupling capacitor on an SOC.

FIG. 2 is a functional block diagram illustrating an exemplary embodiment of two circuits operating in different power domains sharing a decoupling capacitor on an SOC. In this example, a first circuit 202 provides a first processing means for processing data and a second circuit 204 provides a second processing means for processing data. The first circuit 202 is connected to a first voltage source $V_{DD1}$ and the second circuit 204 is connected to a second voltage source $V_{DD2}$. A controller 206 provides a means for switching a decoupling capacitor 112 between the first and second circuits 202 and 204. The decoupling capacitor 112 provides a means for decoupling the first and second circuits 202 and 204. The first circuit 202 may be the CPU 102 and the second circuit 204 may be the GPU 106 (see FIG. 1). However, as those skilled in the art will readily appreciate, the various aspects of a switchable decoupling capacitor presented herein may be applied to any combination of the circuits shown in FIG. 1 and/or any other suitable circuits that may reside on an SOC or other integrated circuit. For example, the controller 206 may be configured to switch the decoupling capacitor 112 between the CPU 102, the GPU 106, memory (not shown), or any suitable combination of circuits. In some exemplary embodiments, the controller 206 may be configured to switch the decoupling capacitor 112 between circuits residing within the CPU 102, GPU 106, or other suitable circuit. Those skilled in the art will be readily able to apply the various aspects of a switching decoupling capacitor to any suitable combination of circuits on an SOC or other integrated circuit based on the teachings presented throughout this disclosure.

Figure 3A:
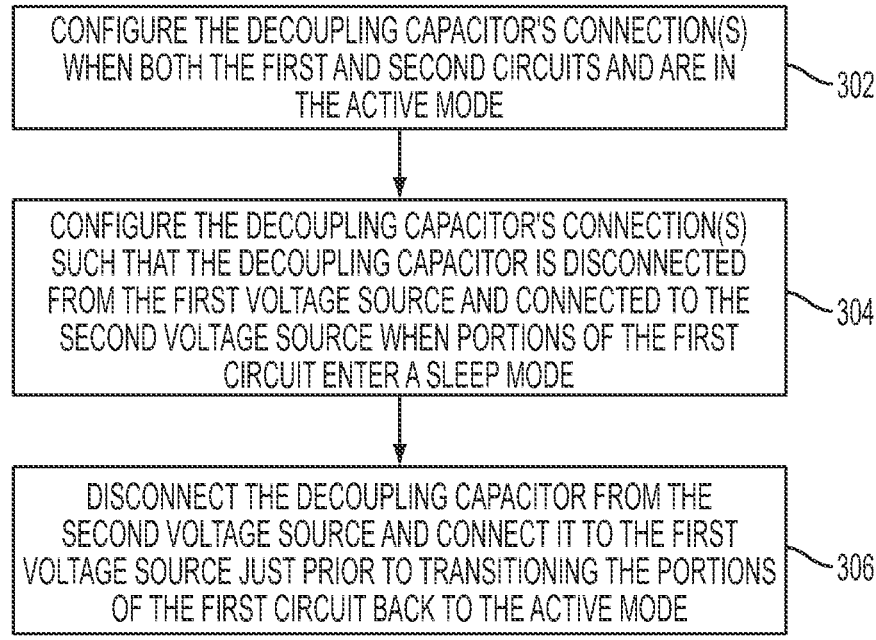
FIG. 3A is a flow chart illustrating the operation of an exemplary embodiment of a controller when switching the first circuit between an active mode and sleep mode.

FIG. 3A is a flow chart illustrating the operation of an exemplary embodiment of the controller when switching portions of the first circuit between the active and sleep mode. Referring to FIGS. 2 and 3A, the controller 206 may configure the decoupling capacitor's connection(s) in several different ways in block 302 when both the first and second circuits 202 and 204 are in the active mode. For example, the controller 206 may disconnect the decoupling capacitor 112 from both the first and second voltage sources $V_{DD1}$ and $V_{DD2}$, or alternatively, connect the decoupling capacitor 112 to one of the first and second voltage sources $V_{DD1}$ and $V_{DD2}$. In the case where the voltage levels of the first and second voltage sources $V_{DD1}$ and $V_{DD2}$ are equal, the decoupling capacitor 112 may be shared by connecting the decoupling capacitor 112 to both the first and second voltage sources $V_{DD1}$ and $V_{DD2}$.

When portions of the first circuit 202 enter a sleep mode in block 304, the controller 206 configures the decoupling capacitor's connection(s) such that the decoupling capacitor 112 is disconnected from the first voltage source $V_{DD1}$ and connected to the second voltage source $V_{DD2}$. In this configuration, the decoupling capacitor 112 is charged by the second voltage source $V_{DD2}$. The controller 206 disconnects the decoupling capacitor 112 from the second voltage source $V_{DD2}$ and connects it to the first voltage source $V_{DD1}$ just prior to transitioning these portions of the first circuit 202 back to the active mode in block 306. The instantaneous current required by these portions of the first circuit 202 is supplied by the decoupling capacitor 112, thereby preventing or reducing a sudden drop in voltage to the other portions of the first circuit 202 by the first voltage source $V_{DD1}$.

Figure 3B:
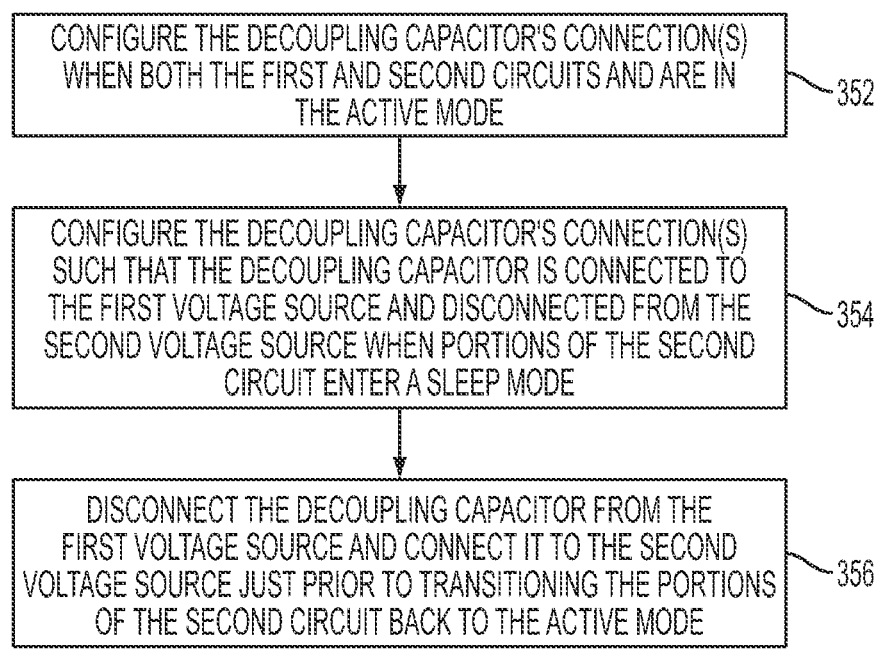
FIG. 3B is a flow chart illustrating the operation of an exemplary embodiment of a controller when switching the second circuit between an active mode and sleep mode.

As similar operation is performed when portions of the second circuit 204 are switched between the active and sleep mode. FIG. 3B is a flow chart illustrating the operation of an exemplary embodiment of the controller under these conditions. Referring to FIGS. 2 and 3B, the controller 206 may configure the decoupling capacitor's connection(s) in several different ways in block 352 when both the first and second circuits 202 and 204 are in the active mode as explained above in connection with FIG. 3A. When portions of the second circuit 204 enter the sleep mode in block 354, the controller 206 configures the decoupling capacitor's connection(s) such that the decoupling capacitor 112 is disconnected from the second voltage source $V_{DD2}$ and connected to the first voltage source $V_{DD1}$. In this configuration, the decoupling capacitor 112 is charged by the first voltage source $V_{DD1}$. The controller 206 disconnects the decoupling capacitor 112 from the first voltage source $V_{DD1}$ and connects it to the second voltage source $V_{DD2}$ just prior to transitioning these portions of the second circuit 204 back to the active mode in block 356. The instantaneous current required by the these portions of the second circuit 204 is supplied by the decoupling capacitor 112, thereby preventing or reducing a sudden drop in voltage to the other portions of the second circuit 204 by the second voltage source $V_{DD2}$.

Figure 4:
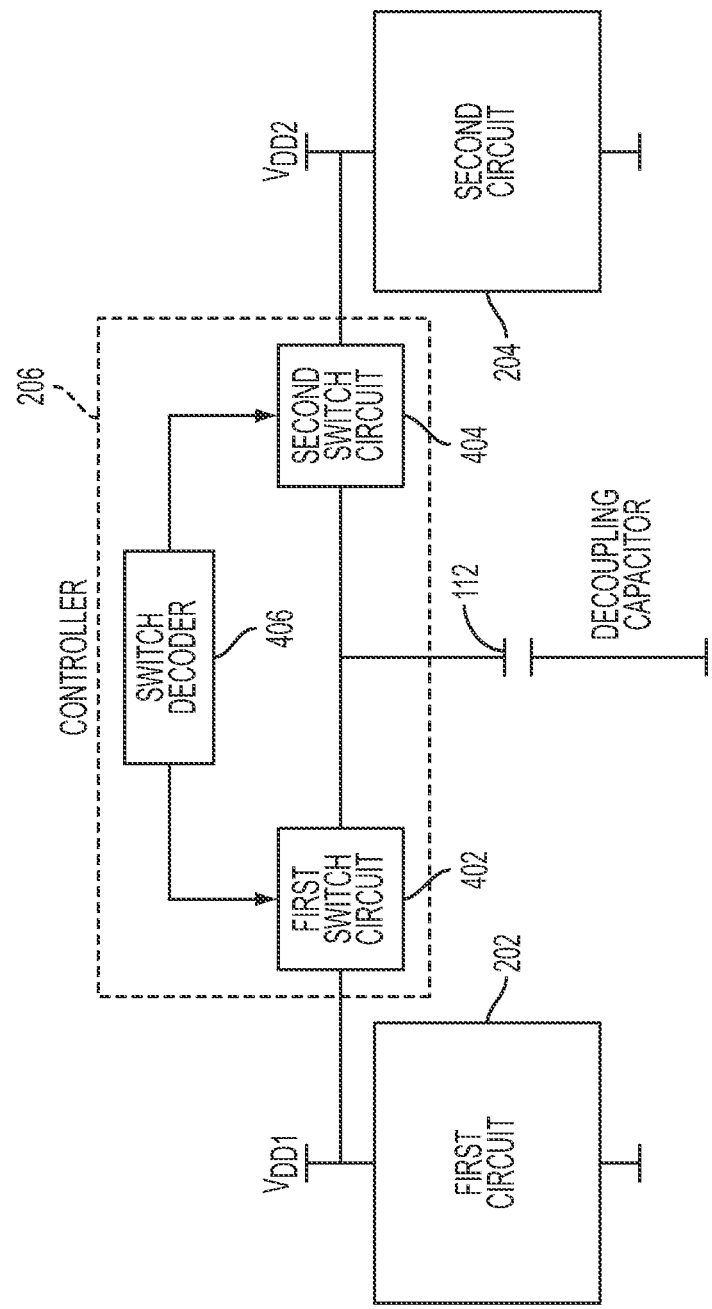
FIG. 4 is a schematic diagram of an exemplary embodiment of a controller.

FIG. 4 is a schematic diagram of an exemplary embodiment of a controller. The controller 206 is shown with a first switch circuit 402 which provides a means for controlling a connection between the decoupling capacitor 112 and the first voltage source $V_{DD1}$, and a second switch circuit 404 which provides a means for controlling a connection between the decoupling capacitor 112 and the second voltage source $V_{DD2}$. The first switch circuit 402 is between the decoupling capacitor 112 and the first circuit 202, and the second switch circuit 404 is between the decoupling capacitor 112 and the second circuit 204. A switch decoder 406 provides a means for controlling the first and second switches 402 and 404 in response to commands from a power management circuit (not shown). The switch decoder 406 connects the decoupling capacitor 112 to the first voltage source $V_{DD1}$ by closing the first switch 402 and disconnects the decoupling capacitor 112 from the first voltage source $V_{DD1}$ by opening the first switch 402. Similarly, the switch decoder 406 connects the decoupling capacitor 112 to the second voltage source $V_{DD2}$ by closing the second switch 404 and disconnects the decoupling capacitor 112 from the second voltage source $V_{DD2}$ by opening the second switch 404.

As described above in connection with FIGS. 2, 3A and 3B, the switch decoder 406 receives a command from the power management circuit to configure the first and second switches 402 and 404 in several different ways when both the first and second circuits 202 and 204 are in the active mode. The switch decoder 406 receives a first command from the power management circuit to open the first switch 402 and close the second switch 404 to charge the decoupling capacitor 112 when portions of the first circuit 202 enter a sleep mode. In one exemplary embodiment, the switch decoder 406 receives a second command from the power management circuit to first open the second switch 404 and the close the first switch 402 when the portions of the first circuit 202 switch back to the active mode. This enables the decoupling capacitor 112 to provide the instantaneous current required by the portions of the first circuit 202 transitioning back to the active mode, thereby preventing or reducing a sudden drop in voltage to the other portions of the first circuit 202 connected to the first voltage source $V_{DD1}$. After the entire first circuit 202 is active, the power management circuit provides another command to the switch decoder 406 to configure the first and second switches 402 and 404 to support the current operating state of the first and second circuits 202 and 204.

In a similar manner, the switch decoder 406 receives a first command from the power management circuit to close the first switch 402 and open the second switch 404 when portions of the second circuit 204 enter a sleep mode to charge the decoupling capacitor 112. The switch decoder 406 receives a second command from the power management circuit to open the first switch 402 and close the second switch 404 when the portions of the second circuit 204 switch back to the active mode. This enables the decoupling capacitor 112 to provide the instantaneous current required by the portions of the second circuit 402 transitioning back to the active mode, thereby preventing or reducing a sudden drop in voltage to the other portions of the second circuit 204 connected to the second voltage source $V_{DD2}$. After the entire second circuit 204 is active, the power management circuit provides another command to the switch decoder 406 to the switch decoder 406 to configure the first and second switches 402 and 404 to support the current operating state of the first and second circuits 202 and 204.

In the case where the voltage levels of the first and second voltage sources $V_{DD1}$ and $V_{DD2}$ are equal, the switch decoder 406 may open and close the first and second switches 402 and 404 in any order to switch the decoupling capacitor 112 between the first and second circuits 202 and 204. However, when the voltage sources $V_{DD1}$ and $V_{DD2}$ are unequal, the first and second switches 402 and 404 should be operated in a break-before-make fashion. That is, when switching the decoupling capacitor 112 from the first circuit 202 to the second circuit 204, the decoupling capacitor 112 should be disconnected from the first circuit 202 before being connected to the second circuit 204. Similarly, when switching the decoupling capacitor 112 from the second circuit 204 to the first circuit 202, the decoupling capacitor 112 should be disconnected from the second circuit 204 before being connected to the second circuit 202.

Figure 5:
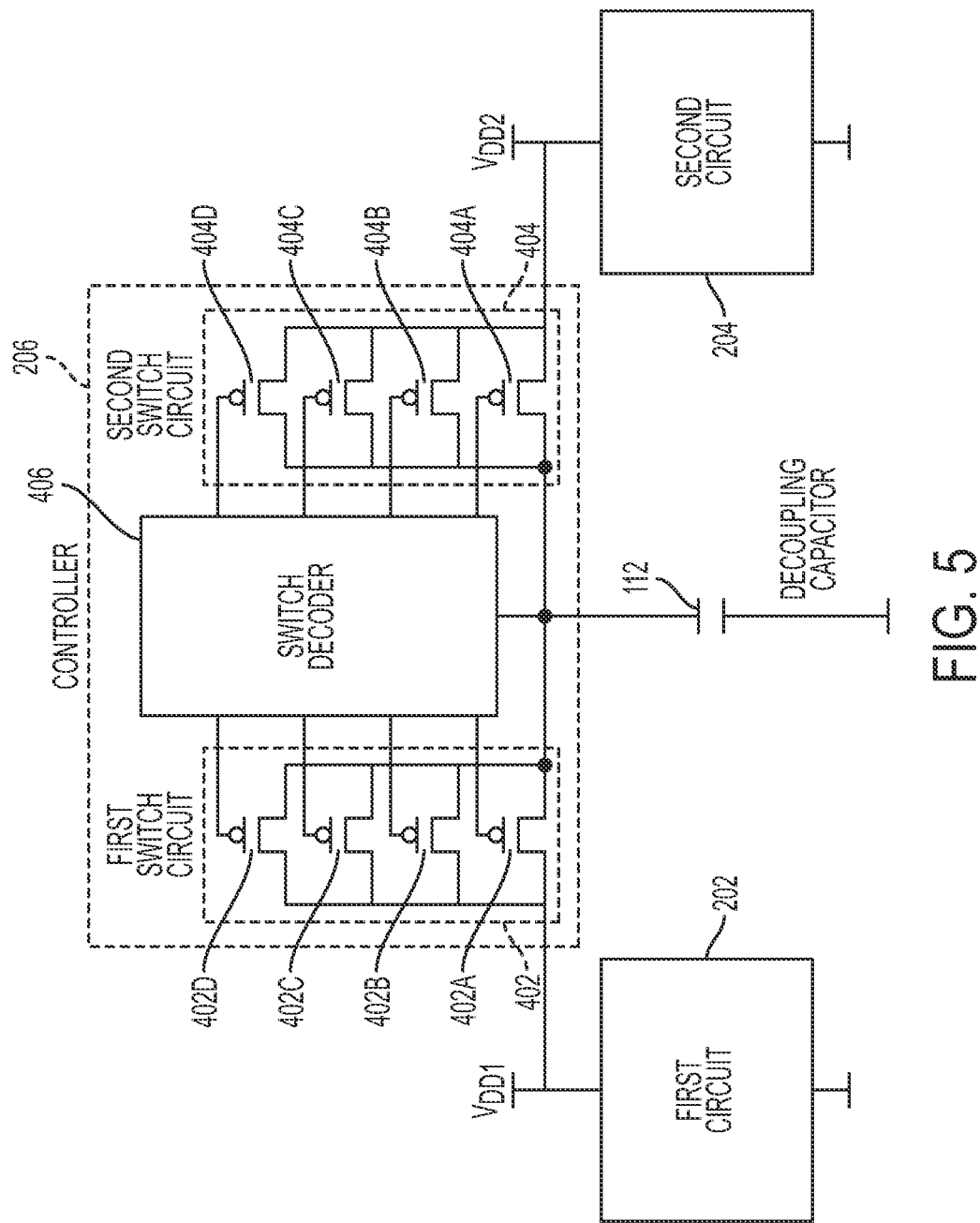
FIG. 5 is a schematic diagram of an exemplary embodiment of controller with variable resistance switches.

FIG. 5 is a schematic diagram of an exemplary embodiment of a controller with variable resistance switches. In this embodiment, the switches 402 and 404 are implemented with a resistance that can be varied by the switch decoder 406 during operation. For example, each switch may be implemented in a parallel arrangement of transistors that connect the decoupling capacitor 112 to one of the voltage sources. Referring to FIG. 5, the first switch 402 is implemented with four transistors 402A-402D connected in parallel between the decoupling capacitor 112 and the first voltage source $V_{DD1}$ and the second switch 404 is implemented with four transistors 404A-404D connected in parallel between the decoupling capacitor 112 and the second voltage source $V_{DD2}$.

The switch decoder 406 varies the resistance of the first and second switches 402 and 404 by controlling the gate inputs to their respective parallel combination of transistors. For example, the switch decoder 406 can disconnect the decoupling capacitor 112 from the first voltage source $V_{DD1}$ by disabling all transistors 402A-402D forming the first switch 402. This may be achieved by applying a logic level 0 to the gates if the switch 402 is implemented with n-channel transistors 402A-402D or a logic level 1 to the gates if the switch 402 is implemented with p-channel transistors 402A-402D. Typically, the switches are implemented with p-channel transistors. The switch decoder 406 may connect the decoupling capacitor 112 to the first voltage source $V_{DD1}$ by enabling one or more of the transistors 402A-402D by changing the polarity of the logic level applied to the gate(s). The more transistors of switch 402 that the switch decoder 406 enables, the lower the resistance of the switch 402. For example, the switch 402, when operating to connect the decoupling capacitor 112 to the first voltage source $V_{DD1}$, will have a maximum resistance with one of the four transistors 402A-402D enabled and a minimum resistance with all four transistors 402A-402D enabled. The switch decoder 406 may set the switch 402 to a resistance between the minimum and maximum by enabling two or three of the transistors 402A-402B. The switch decoder 406 may incrementally decrease the resistance of the switch 402 by enabling the transistors 402A-402D in a stepwise fashion by enabling the first transistor 402A, followed by the second transistor 402B, and then the third transistor 402C, and finally the fourth transistor 402D. The operation may be reversed to incrementally increase the resistance. The number of parallel transistors used to implement the first switch 402 may vary depending on the resistive resolution required by any particular application.

The switch decoder 406 operates the second switch 404 in a similar manner. The switch decoder 406 disconnects the decoupling capacitor 112 from the second voltage source $V_{DD2}$ by disabling all transistors 404A-404D forming the second switch 404. This may be achieved by applying a logic level 0 to the gates if the switch 404 is implemented with n-channel transistors 404A-404D or a logic level 1 to the gates if the switch 404 is implemented with p-channel transistors 404A-404D. The switch decoder 406 may connect the decoupling capacitor 112 to the second voltage source $V_{DD2}$ by enabling one or more of the transistors 404A-404D by changing the polarity of the logic level applied to the gate(s). The more transistors of switch 404 that the switch decoder 406 enables, the lower the resistance of the switch 404. For example, the switch 404, when operating to connect the decoupling capacitor 112 to the second voltage source $V_{DD2}$, will have a maximum resistance with one of the four transistors 404A-404D enabled and a minimum resistance with all four transistors 404A-404D enabled. The switch decoder 406 may set the switch 404 to a resistance between the minimum and maximum by enabling two or three of the transistors 404A-404B. The switch decoder 406 may incrementally decrease the resistance of the switch 404 by enabling the transistors 404A-404D in a stepwise fashion by enabling the first transistor 404A, followed by the second transistor 404B, and then the third transistor 404C, and finally the fourth transistor 404D. The operation may be reversed to incrementally increase the resistance. The number of parallel transistors used to implement the second switch 404 may vary depending on the resistive resolution required by any particular application.

The variable resistance switches 402 and 404 may be used by the switch decoder 406 to control damping. For example, when the first circuit 202 is in an active mode and portions of the second circuit 204 are in a sleep mode, the decoupling capacitor 112 is connected to the first voltage source $V_{DD1}$ by the first switch 402 and disconnected from the second voltage source $V_{DD2}$ by the second switch 404. The resistance of the first switch 402 may be set high to provide slow charging of the decoupling capacitor 112, and thereby prevent a sudden drop in voltage in the $V_{DD1}$ voltage domain due to the charging of the capacitor. When the portions of the second circuit 204 transition from a sleep mode to an active mode, the connection of the decoupling capacitor 112 is switched by the switch decoder 406 with the decoupling capacitor 112 being connected to the second voltage source $V_{DD2}$ by the second switch 404 and disconnected from the first voltage source $V_{DD1}$ by the first switch 402. The resistance of the second switch 404 may be set low by the switch decoder 406 to provide a quick discharge path for the decoupling capacitor 112 to the second circuit 204 to prevent or minimize a sudden drop in voltage in the $V_{DD2}$ voltage domain.

Similarly, when the second circuit 204 is in an active mode and the first circuit 202 is in a sleep mode, the decoupling capacitor 112 is connected to the second voltage source $V_{DD2}$ by the second switch 404 and disconnected from the first voltage source $V_{DD1}$ by the first switch 402. The resistance of the second switch 404 may be set high to provide slow charging of the decoupling capacitor 112, and thereby prevent a sudden drop in voltage in the $V_{DD1}$ voltage domain. When the first circuit 202 transitions from a sleep mode to an active mode, the connection of the decoupling capacitor 112 is switched by the switch decoder 406 with the decoupling capacitor 112 being connected to the first voltage source $V_{DD1}$ by the first switch 402 and disconnected from the second voltage source $V_{DD2}$ by the second switch 404. The resistance of the first switch 404 may be set low by the switch decoder 406 to provide a quick discharge path for the decoupling capacitor 112 to the first circuit 202 to prevent or minimize a sudden drop in voltage in the $V_{DD1}$ voltage domain.

Figure 6:
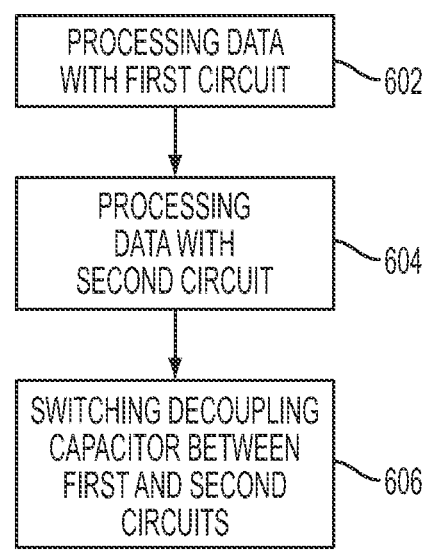
FIG. 6 is a flow chart illustrating an exemplary embodiment of a method of decoupling the first and second circuits.

FIG. 6 is a flow chart illustrating an exemplary embodiment of a method of decoupling the first and second circuits. In this example, the first circuit is powered by a first voltage source and the second circuit is powered by a second voltage source. The method includes processing data in block 602 with the first circuit, and processing data in block 604 with the second circuit. The method further includes switching a decoupling capacitor between the first and second voltage sources in block 606.

In at least one exemplary embodiment, the decoupling capacitor is switched by controlling a connection between the decoupling capacitor and the first voltage source with the first switching circuit, and controlling a connection between the decoupling capacitor and the second voltage source with the second switching circuit. The connection between the decoupling capacitor and the first voltage source is controlled to charge the decoupling capacitor from the first voltage source, and the connection between the decoupling capacitor and the second voltage source is controlled to supply current from the charged decoupling capacitor to the second circuit. For example, the connection between the decoupling capacitor and the first voltage source may be controlled to charge the decoupling capacitor from the first voltage source while the first circuit is in an active mode and the second circuit is in a sleep mode, and the connection between the decoupling capacitor and the second voltage source may be controlled to supply current from the charged decoupling capacitor to the second circuit when the second circuit is transitioned from the sleep mode to an active mode.

In some exemplary embodiments, each of the first and second switching circuits comprises a variable resistance. The variable resistance may be implemented by a plurality of parallel transistors independently controllable to vary the resistance thereof as described in greater detail above. In this example, the connection between the decoupling capacitor and the first voltage source may be controlled to charge the decoupling capacitor from the first voltage source through a first resistance, and the connection between the decoupling capacitor and the second voltage source is controlled to supply current from the charged decoupling capacitor to the second circuit, through a second resistance, where the first resistance is higher than the second resistance. For example, the connection between the decoupling capacitor and the first voltage source may be controlled to charge the decoupling capacitor from the first voltage source slowly while the first circuit is in an active mode and the second circuit is in a sleep mode, and the connection between the decoupling capacitor and the second voltage source may be controlled to supply current from the charged decoupling capacitor to the second circuit quickly when the second circuit is transitioned from the sleep mode to an active mode.

The specific order or hierarchy of blocks in the method of operation described above is provided merely as an example. Based upon design preferences, the specific order or hierarchy of blocks in the method of operation may be re-arranged, amended, and/or modified. The accompanying method claims include various limitations related to a method of operation, but the recited limitations are not meant to be limited in any way by the specific order or hierarchy unless expressly stated in the claims.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An integrated circuit, comprising:
   a first circuit configured to be powered by a first voltage source;
   a second circuit configured to be powered by a second voltage source;
   a decoupling capacitor; and
   a controller configured to switch the decoupling capacitor between the first and second voltage sources, the controller comprising:
      a first switch circuit between the decoupling capacitor and the first voltage source:
      a second switch circuit between the decoupling capacitor and the second voltage source; and
      a switch decoder configured to control the first and second switch circuits, wherein each of the first and second switch circuits comprises a variable resistance, the switch decoder further configured to control the first switch circuit to charge the decoupling capacitor from the first voltage source through a first resistance, and to control the second switch circuit to supply current from the charged decoupling capacitor to the second circuit through a second resistance, the first resistance being higher than the second resistance.

2. The integrated circuit of claim 1 wherein the switch decoder is further configured to control the first switch circuit to charge the decoupling capacitor from the first voltage source while the first circuit is in an active mode and the second circuit is in a sleep mode, and to control the second switch circuit to supply current from the charged decoupling capacitor to the second circuit when the second circuit transitions from the sleep mode to an active mode.

3. The integrated circuit of claim 1 wherein each of the first and second switch circuits comprises a plurality of parallel transistors each independently controllable by the switch decoder to vary the resistance thereof.

4. An integrated circuit, comprising:
   first processing means for processing data, the first processing means being configured to be powered by a first voltage source;
   second processing means for processing data, the second processing means being configured to be powered by a second voltage;
   decoupling means for decoupling the first and second processing means; and
   means for switching the decoupling means between the first and second voltage sources, the means for switching comprising:
      first switching means for controlling a connection between the decoupling means and the first voltage source;
      second switch means for controlling a connection between the decoupling means and the second voltage source; and
      means for controlling the first and second switch means, wherein each of the first and second switching means comprises a variable resistance, the means for controlling the first and second switch means further configured to control the first switching means to charge the decoupling means from the first voltage source through a first resistance, and to control the second switch means to supply current from the charged decoupling means to the second processing means through a second resistance, the first resistance being higher than the second resistance.

5. The integrated circuit of claim 4 wherein the means for controlling the first and second switch means is further configured to control the first switching means to charge the decoupling means from the first voltage source while the first processing means is in an active mode and the second processing means is in a sleep mode, and to control the second switch means to supply current from the charged decoupling means to the second processing means when the second processing means transitions from the sleep mode to an active mode.

6. The integrated circuit of claim 4 wherein each of the first and second switching means comprises a plurality of parallel transistors each independently controllable by the means for controlling the first and second switch means to vary the resistance thereof.

7. A method of decoupling first and second circuits, comprising:
   processing data with the first circuit powered by a first voltage source;

processing data with the second circuit powered by a second voltage; and switching a decoupling capacitor between the first and second voltage sources, wherein the decoupling capacitor is switched by controlling a connection between the decoupling capacitor and the first voltage source with a first switching circuit, and controlling a connection between the decoupling capacitor and the second voltage source with a second switching circuit, each of the first and second switching circuits comprising a variable resistance, the connection between the decoupling capacitor and the first voltage source controlled to charge the decoupling capacitor from the first voltage source through a first resistance, and wherein the connection between the decoupling capacitor and the second voltage source is controlled to supply current from the charged decoupling capacitor to the second circuit, through a second resistance, the first resistance being higher than the second resistance.

8. The method of claim 7 wherein the connection between the decoupling capacitor and the first voltage source is controlled to charge the decoupling capacitor from the first voltage source while the first circuit is in an active mode and the second circuit is in a sleep mode, and wherein the connection between the decoupling capacitor and the second voltage source is controlled to supply current from the charged decoupling capacitor to the second circuit when the second circuit is transitioned from the sleep mode to an active mode.

9. The method of claim 7 wherein each of the first and second switching circuits comprises a plurality of parallel transistors each independently controllable to vary the resistance thereof.

* * * * *